United States Patent [19]

Suda et al.

[11] Patent Number: 5,148,037
[45] Date of Patent: Sep. 15, 1992

[54] POSITION DETECTING METHOD AND APPARATUS

[75] Inventors: Shigeyuki Suda, Yokohama; Sakae Houryu; Noriyuki Nose, both of Tokyo, all of Japan

[73] Assignee: Canon Kabushiki Kaisha, Tokyo, Japan

[21] Appl. No.: 675,059

[22] Filed: Mar. 26, 1991

Related U.S. Application Data

[63] Continuation of Ser. No. 403,936, Sep. 7, 1989, abandoned.

[30] Foreign Application Priority Data

Sep. 9, 1988 [JP] Japan .................. 63-225804

[51] Int. Cl.$^5$ ............................................. G01N 21/86
[52] U.S. Cl. ..................................... 250/548; 356/401
[58] Field of Search ................ 250/548, 557; 356/400, 356/401

[56] References Cited

U.S. PATENT DOCUMENTS

| | | | |
|---|---|---|---|
| 4,037,969 | 7/1977 | Feldman et al. | 356/172 |
| 4,326,805 | 4/1982 | Feldman et al. | 356/399 |
| 4,360,273 | 11/1982 | Thaxter | 356/354 |
| 4,398,824 | 8/1983 | Feldman et al. | 356/401 |
| 4,514,858 | 4/1985 | Novak | 378/34 |
| 4,539,482 | 9/1985 | Nose | 250/578 |
| 4,629,313 | 12/1986 | Tanimoto | 356/401 |
| 4,636,626 | 1/1987 | Hazama et al. | 250/557 |
| 4,656,347 | 4/1987 | Une et al. | 250/548 |
| 4,815,854 | 3/1989 | Tanaka et al. | 356/401 |
| 4,904,087 | 2/1990 | Harvey et al. | 250/548 |

FOREIGN PATENT DOCUMENTS 56-157033 12/1981 Japan .
61-111402 5/1986 Japan .
2073950 10/1981 United Kingdom .

OTHER PUBLICATIONS

Kinoshita, et al., "A Dual Grating Alignment Technique for X-ray Lithography", J. Vac. Sci. Tech. vol. B1, No. 4, Oct. 1983, pp. 1276-1279.

*Primary Examiner*—David C. Nelms
*Attorney, Agent, or Firm*—Fitzpatrick, Cella, Harper & Scinto

[57] ABSTRACT

A method and apparatus for detecting a positional relationship between first and second objects is disclosed, which includes a light source for projecting light to the first and second objects, a photodetecting system for detecting light from one of the first and second objects irradiated with the light from the light source, the detecting system being operable to detect first light whose position of incidence upon a predetermined plane is dependent upon the positional relationship of the first and second objects in a direction along the interval therebetween and in a direction perpendicular to the interval, second light whose position of incidence upon the predetermined plane is dependent upon the positional relationship of the first and second objects in the direction of the interval therebetween, and third light whose position of incidence upon the predetermined plane is independent of the positional relationship of the first and second objects in both the direction of the interval and the direction perpendicular to the interval, and a positional relationship detecting system for detecting the positional relationship of the first and second objects in the direction of the interval and the direction perpendicular to the interval, on the basis of the detection by the photodetecting system.

17 Claims, 11 Drawing Sheets

$l_1$ INPUT SIDE

ON 1ST OBJECT

ON 2ND OBJECT

POSITION DETECTING METHOD AND APPARATUS

This application is a continuation of prior application, Ser. No. 07/403,936, filed Sep. 7, 1989, now abandoned.

FIELD OF THE INVENTION AND RELATED ART

This invention generally relates to a position detecting method and apparatus suitably usable, for example, in a semiconductor microcircuit device manufacturing exposure apparatus for lithographically transferring a fine electronic circuit pattern formed on the surface of a first object (original) such as a mask or reticle (hereinafter simply "mask") onto the surface of a second object (workpiece) such as a wafer, for relatively positioning or aligning the mask and the wafer.

In exposure apparatuses for use in the manufacture of semiconductor devices, the relative alignment of a mask and a wafer is one important factor with respect to ensuring improved performance. Particularly, as for alignment systems employed in recent exposure apparatuses, submicron alignment accuracies or more strict accuracies are required in consideration of the demand for a higher degree of integration of semiconductor devices.

In many types of alignment systems, features called "alignment patterns" are provided on a mask and a wafer and, by utilizing positional information obtainable from these patterns, the mask and wafer are aligned. As for the manner of executing the alignment, an example is a method wherein the amount of relative deviation of these alignment patterns is detected on the basis of image processing. Another method is proposed in U.S. Pat. Nos. 4,037,969 and 4,326,805 and Japanese Laid-Open Patent Application, Laid-Open No. Sho 56-157033, wherein so-called zone plates are used as alignment patterns upon which light is projected and wherein the positions of light spots formed on a predetermined plane by lights from the illuminated zone plates are detected.

Generally, an alignment method utilizing a zone plate is relatively insensitive to any defect in an alignment pattern and therefore assures relatively high alignment accuracies, as compared with an alignment method simply using a traditional alignment pattern.

Figure 1A:
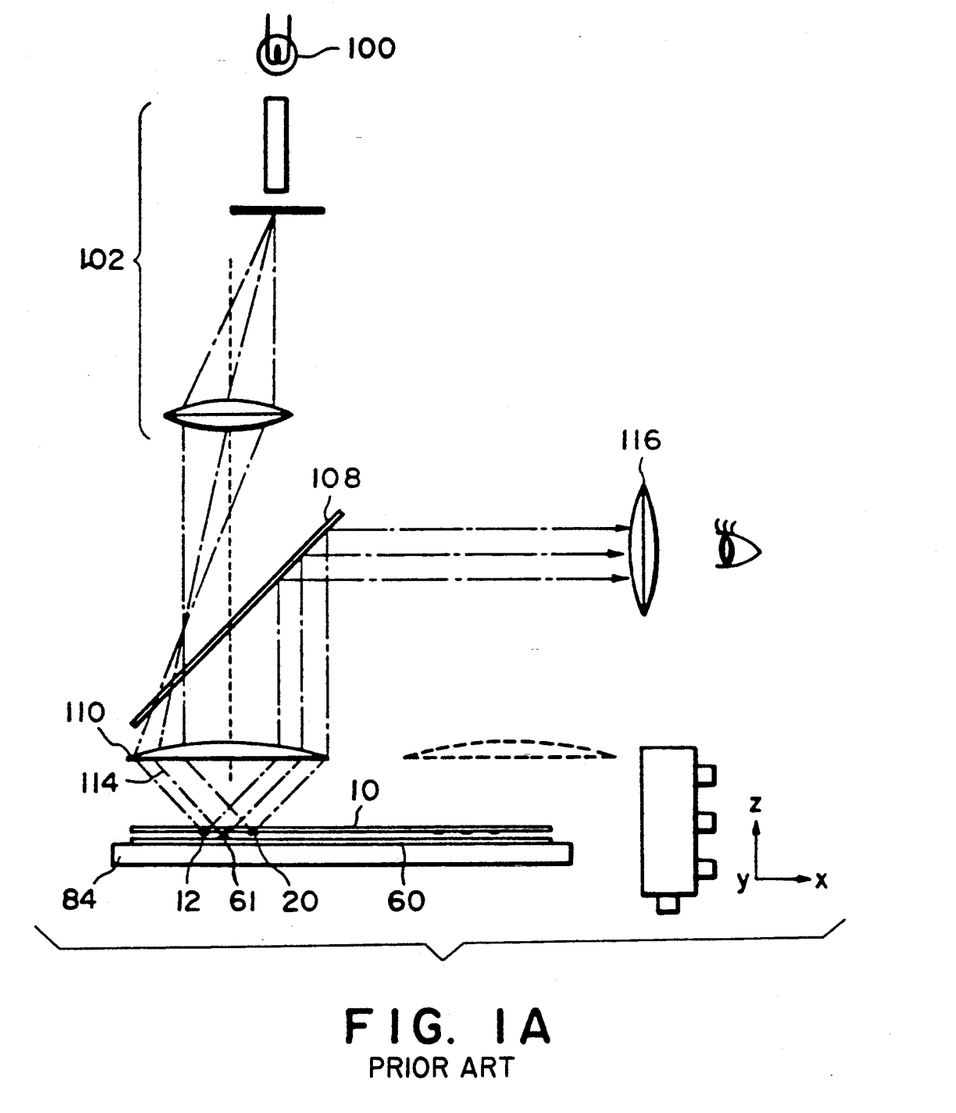
FIGS. 1A, 1B and 2 are explanatory views, illustrating a known type alignment system.
Figure 1B:
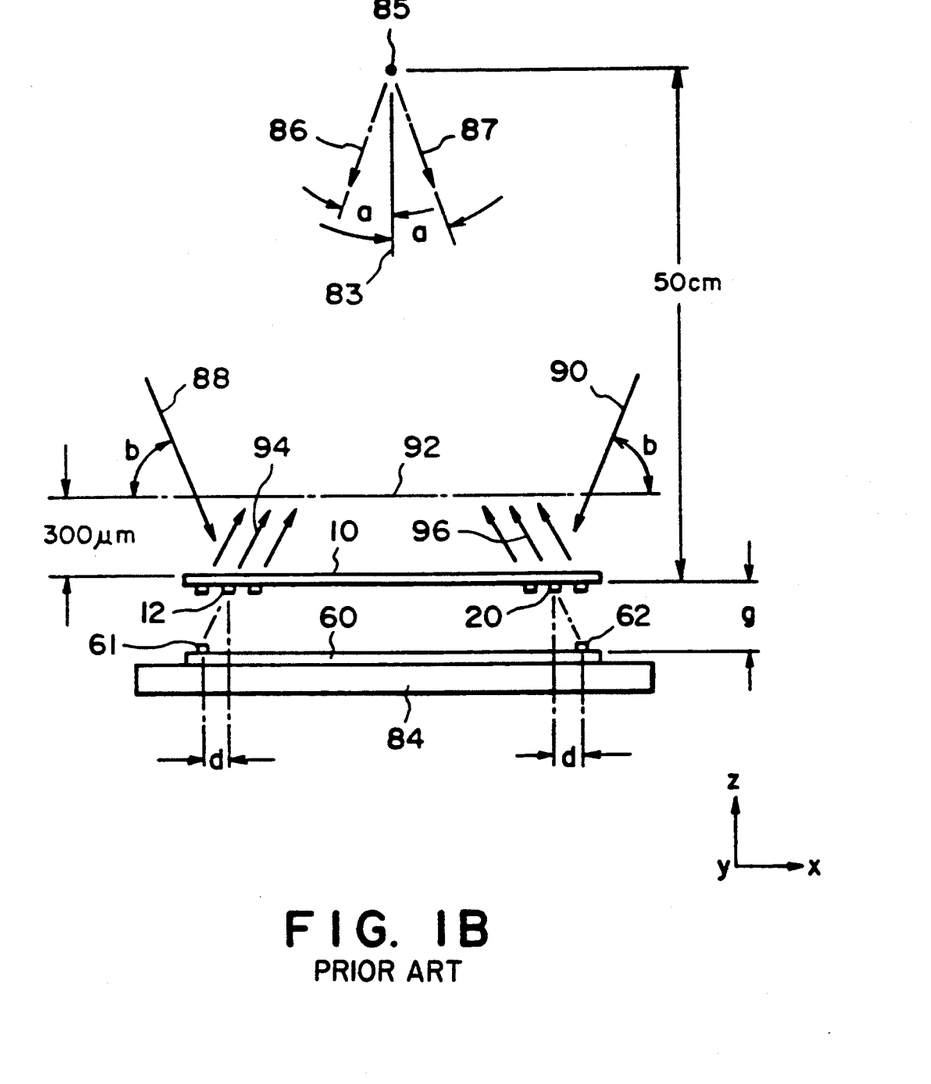

FIGS. 1A and 1B are schematic views of a known type alignment system utilizing zone plates.

In FIGS. 1A and 1B, a light emanating from a light source 100 passes through an optical system 102 and a half mirror 108 and is transformed by a lens 110 into parallel light. Thereafter, the light illuminates mask alignment patterns 12 and 20 on a mask 10 and a wafer alignment pattern 61 on a wafer 60 which is placed on a support table 84. Each of these alignment patterns 12, 20 and 61 is provided by a reflection type zone plate and functions to form a spot of focused light on a plane 92. The amount of relative deviation of the positions of these light spots formed on the plane 92 is detected through the condensing lens 110 and a lens 116.

In accordance with the detection, the wafer support table 84 is driven to relatively align the mask 10 and the wafer 60.

FIG. 1B is an explanatory view, illustrating the relationship of lights from the mask alignment patterns 12 and 20 and the wafer alignment pattern 61, shown in FIG. 1A.

In FIG. 1B, a portion of each inputted light 88 or 90 is diffracted by the mask alignment pattern 12 or 20 and forms a spot of focused light in the neighborhood of the plane 92. Another portion of the light passes through the mask 10 in the form of a zero-th order transmission light and is collected in the neighborhood of the plane 92, to form a spot of focused light representing the wafer position. In the illustrated example, when the light diffracted by the wafer 60 forms a spot, the mask 10 functions merely as a transparent member.

The position of each spot of focused light as formed by the wafer alignment pattern 61 or 62 in the described manner can shift along the plane 92, in accordance with the amount of deviation of the wafer 60 relative to the mask 10.

Conventionally, such a deviation is detected and, based on this, the mask 10 and the wafer 60 are brought into alignment with each other.

In the alignment system as illustrated in FIGS. 1A and 1B, the gap or interval g between the mask and the wafer contains an indeterminate value of a certain amount and, from which the following inconveniences arise:

Here, reference will be made to FIG. 2. Depending on the design, the state of alignment of a mask and a wafer can be detected at any one of the sites of light spots 78a and 78b. Since, however, a deviation $\Delta \sigma'$ of each light spot is dependent on both of the deviation $\Delta \sigma$ of the mask and the wafer and the gap g therebetween, it is possible that many pairs of deviations $\Delta \sigma$ and gaps g correspond to a single deviation $\Delta \sigma'$. This results in that, in a case when the state of alignment is to be detected at the site of the light spot 78a and if, when the correct spacing g is not attained, the light is concentrated at the site of the spot 78b, then the exact measurement of the amount of deviation $\Delta \sigma'$ cannot determine the deviation $\Delta \sigma$ exactly. For this reason, a single alignment operation which is normally sufficient is insufficient and two or more operations must be done repeatedly, resulting in reduction in throughput.

On an occasion when the state of alignment is to be detected at the site of the focused light spot 78b and if the gap g has a rough value, the exact measurement of the amount of deviation $\Delta \sigma'$ does not always make the amount of deviation $\Delta \sigma$ equal to zero, resulting in incorrect discrimination of the state of alignment.

Figure 2:
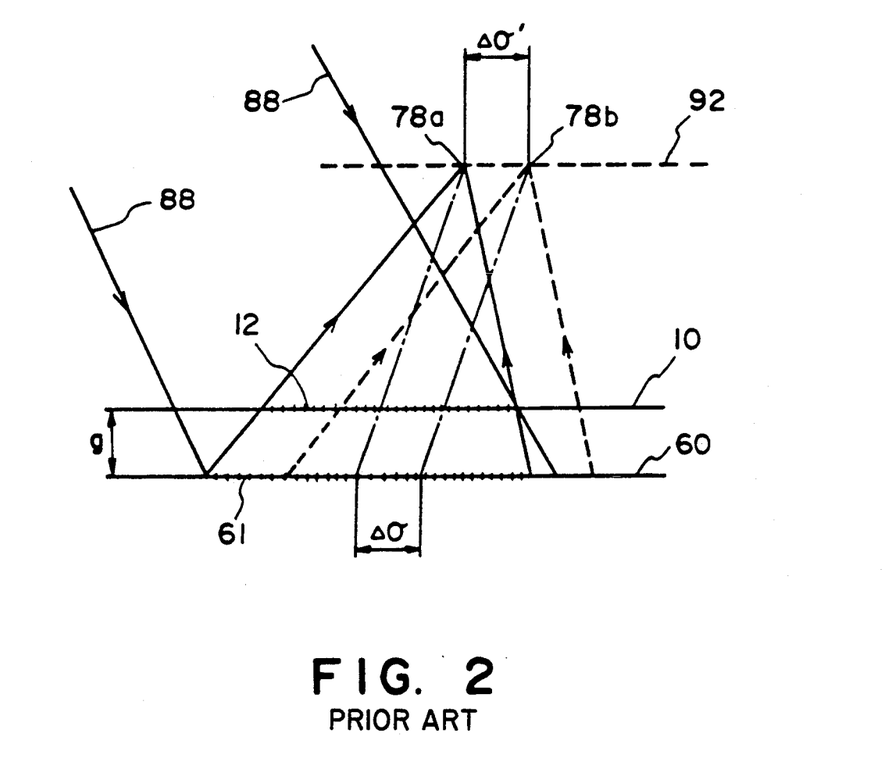

Additionally, if in FIG. 2 a measured value of the interval between the mask and the wafer contains an error of an amount $\Delta g$, then there occurs an error $\Delta g$ in the deviation $\Delta \sigma'$. Since the deviations $\Delta \sigma'$ and $\Delta \sigma$ are in a one-to-one relationship, an error of an amount $\Delta g$ is also produced in the deviation $\Delta \sigma$.

In order to accomplish the alignment with a precision of 0.01 micron, for example, the interval should be set at least at a lowest precision on an order not more than 0.01 micron. With the conventional method, it is difficult to accomplish this. Additionally, any attempts at enhancement in the precision would make the whole structure of the apparatus quite complicated.

SUMMARY OF THE INVENTION

It is an object of the present invention to provide a position detecting system of a simple structure, by which error factors caused in aligning a first object such as a mask, for example, and a second object such as a wafer, for example, can be avoided such that the alignment of them can be attained with high precision and easily.

It is another object of the present invention to provide a position detecting system by which, through a single detecting means, the positional relationship between first and second objects in a direction of the interval therebetween as well as the positional relationship therebetween in a direction perpendicular to the direction of interval, can be detected at the same time.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 3:
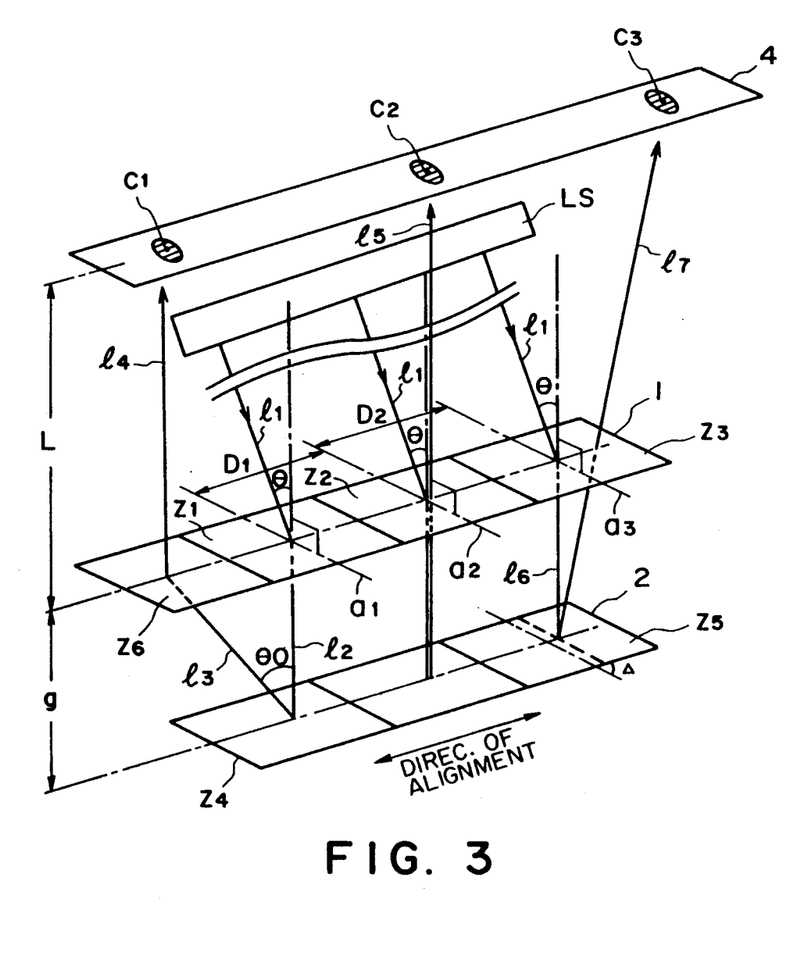
FIG. 3 is a fragmentary and schematic view, showing a major portion of a first embodiment of the present invention.
Figure 4:
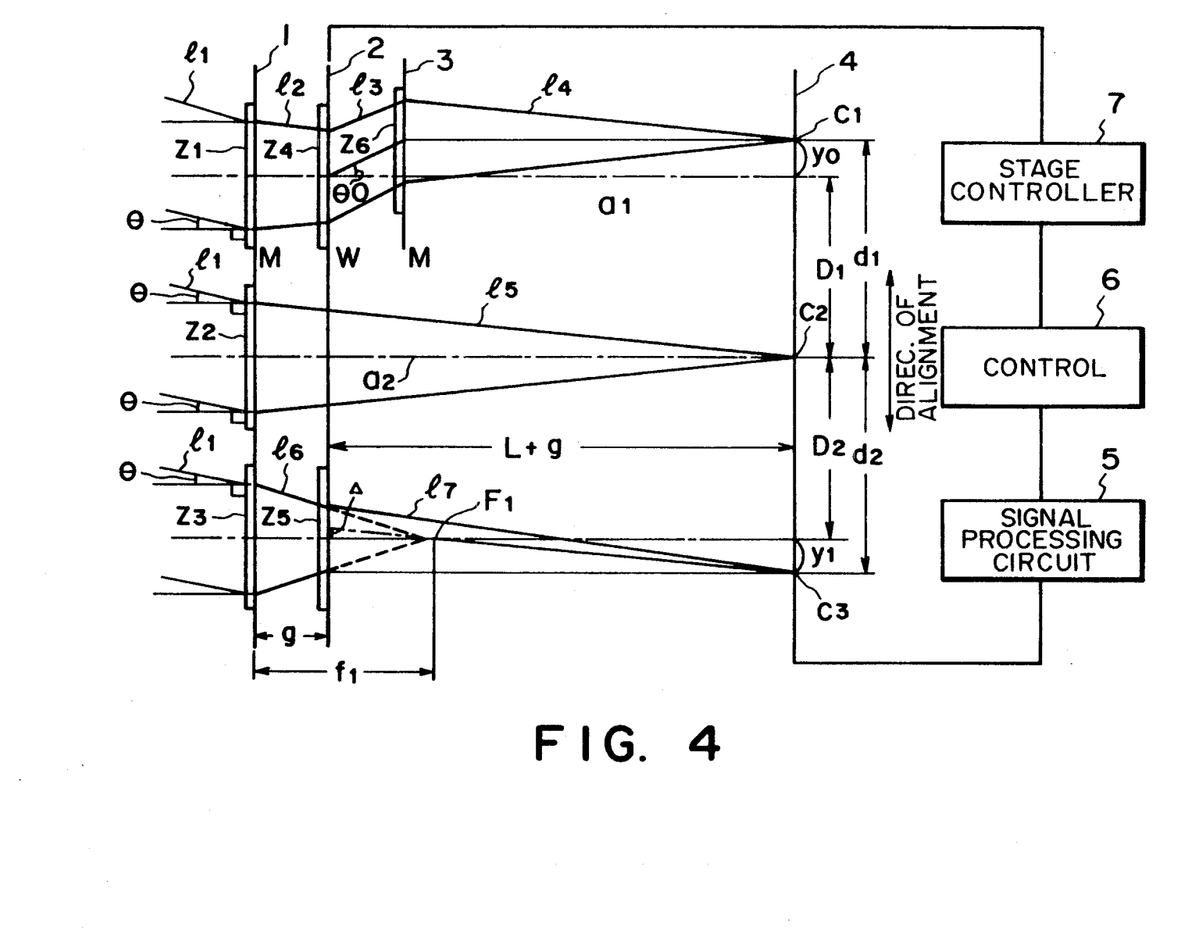
FIG. 4 is a schematic representation showing, in an unfolded view, the optical paths in the major portion of the FIG. 3 embodiment.

FIG. 3 is a schematic representation of a major portion of a first embodiment of the present invention, and FIG. 4 is a schematic representation wherein paths of lights are illustrated in an unfolded view.

In FIGS. 3 and 4, a light flux $l_1$ emanates from a light source LS which may comprise a semiconductor laser or LED, for example. The light $l_1$ is incident on physical optic elements Z1, Z2 and Z3 provided on a first object such as a mask, with an angle of incidence of $\theta$. Details of the physical optic elements will be described later. Denoted at 2 is a second object such as a wafer, for example, which is disposed opposed to the first object 1 with an interval or gap g maintained therebetween. Numeral 3 denotes the position on the first object at which the light reflected (diffracted) by the second object impinges again on the first object. Character $\Delta$ denotes the amount of relative positional deviation of the first object 1 and the second object 2. The first object is provided with physical optic elements Z1, Z2, Z3 and Z6 each of which is of a transmission type. The light $l_1$ is projected on the physical optic elements Z1, Z2 and Z3. The second object 2 is provided with reflection type physical optic elements Z4 and Z5, although they are illustrated in FIG. 4 as being of transmission type, for convenience. Each of these physical optic elements Z1-Z6 may be provided by a diffraction grating or a zone plate, for example.

Figure 5:
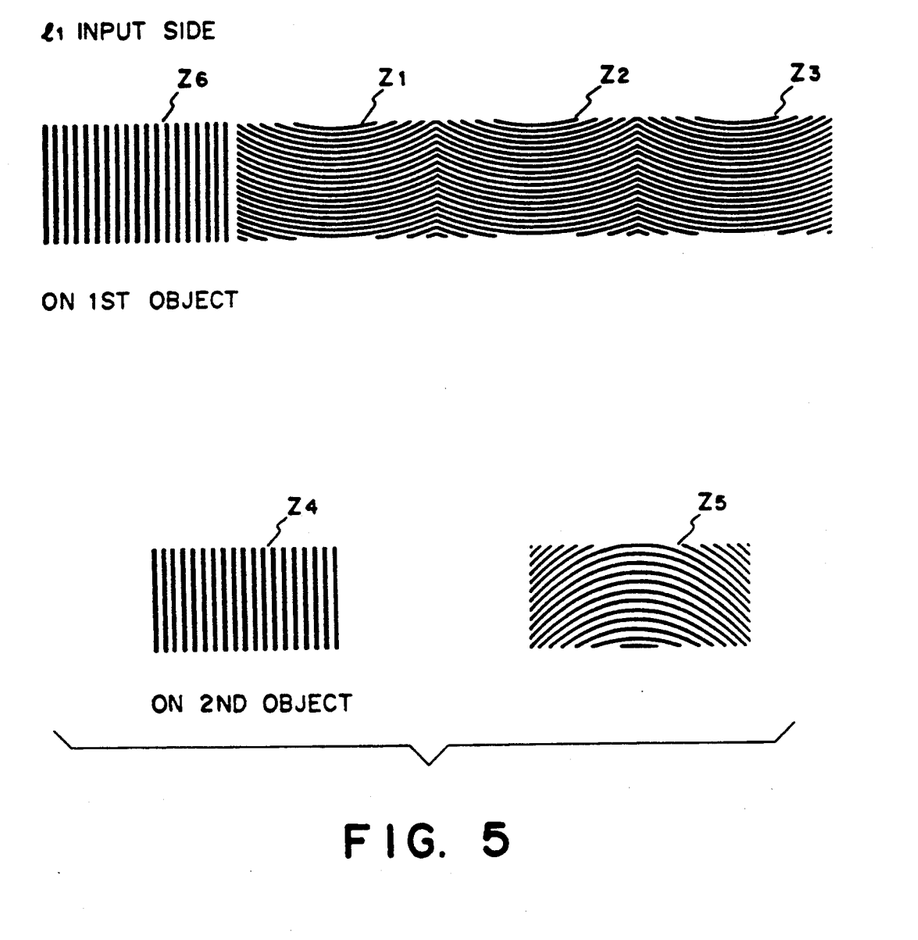
FIG. 5 is a schematic representation, illustrating examples of patterns of physical optic elements provided on first and second objects.

FIG. 5 illustrates examples of patterns of physical optic elements to be provided on the first and second objects 1 and 2, in this embodiment.

The physical optic element Z3 has a lens function having a focal point F1 and a focal length f1. The physical optic element Z4 is arranged to constantly produce a diffraction light in a predetermined direction, independently of the amount of positional deviation. Each of characters $l_2$–$l_7$ denotes diffraction light of a predetermined order or orders, from a corresponding one of the physical optic elements. Denoted at 4 is a sensor which may comprise a line sensor or an area sensor, for example, and the sensor is disposed at a distance L from the first object 1. Denoted at a1, a2 and a3 are optical axes of the physical optic elements Z1, Z2 and Z3, respectively. The optical axes a1 and a2 are spaced by a distance D1, while the optical axes a2 and a3 are spaced by a distance D2.

Points C1, C2 and C3 each denotes the center of gravity of a corresponding diffraction light $l_4$, $l_5$ or $l_7$, upon the sensor 4 surface. The point C1 is at a distance y0 from the optical axis a1, and the point C3 is at a distance y1 from the optical axis a3.

Here, the term "center of gravity of light" means such a point that, when in the cross-section of the light a position vector of each point in the section is multiplied by the light intensity of that point and the thus obtained products are integrated over the entire section, the integrated value has a "zero vector".

Signal processing circuit 5 is arranged to detect the center of gravity of each light $l_4$, $l_5$ or $l_7$ from the information supplied by the sensor 4, and also to detect any positional deviation $\Delta$ and the interval g between the first and second objects 1 and 2, on the basis of the distances y1, y0, D1, D2 and the like and by using equations which will be described later. Control circuit 6 is operable in accordance with the information concerning the positional deviation $\Delta$ and the gap g, as supplied from the signal processing circuit 5, to control the deviation $\Delta$ and the gap g between the first and second objects 1 and 2.

Stage controller 7 is operable in response to instructions from the control circuit 6, to drive a stage (not shown) on which the second object 2 is placed.

In the present embodiment, the light $l_1$ from the light source is projected on each of the physical optic elements Z1, Z2 and Z3 which are provided on the first object 1. Of these physical optic elements, the physical optic element Z1 produces first order diffraction light $l_2$ which is in the form of a convergent beam. The diffraction light $l_2$ enters the physical optic element Z4 on the second object 2, whereby first order diffraction light $l_3$ having a chief ray extending with an angle $\theta_0$ with respect to the optical axis a1 is produced. As the diffraction light $l_3$ is incident on the physical optic element Z6, first order diffraction light $l_4$ having a chief ray extending in parallel to the optical axis a1 is produced. The diffraction light $l_4$ is focused on the sensor 4 surface, at a position spaced by a distance y0 from the optical axis a1.

The physical optic elements Z4 and Z6 are arranged to produce diffraction lights having their chief rays extending with an angle $\theta_0$ and parallel to the optical axis a1, respectively, independently of the positional deviation Δ (i.e. independently of the position of incidence of light thereupon). Therefore, the distance y0 is independent of the positional deviation Δ.

If, in this embodiment, the distance y0 is so small that the measurement thereof is difficult, enlargement by using a lens system, for example, may be adopted. The optical path for the lights $l_1-l_4$ serves to provide a detection system A.

The physical optic element Z3 has a convex lens function having a focal point F1 and a focal length f1. A portion of the light $l_1$ incident on the physical optic element Z3 is transformed into first order diffraction light $l_6$ in the form of a convergent beam and enters the physical optic element Z5. The physical optic element Z5 has a concave lens function and, by this function, first order diffraction light $l_7$ whose direction of diffraction is changeable with the positional deviation Δ, is produced. The diffraction light $l_7$ simply passes through the physical optic element Z3, as zero-th order diffraction light. The diffraction light $l_7$ is focused at a position on the sensor 4 surface, spaced by a distance y1 from the optical axis a3. Since the distance between the sensor 4 and the first object 1 is maintained at a constant value L, the magnitude of the distance y1 is dependent upon the gap g and the positional deviation Δ. The optical path for the lights $l_1$, $l_6$ and $l_7$ serves to provide a detection system C.

On the other hand, the light $l_1$ incident on the physical optic element Z2 is diffracted thereby. Of all the diffracted rays, first order diffraction light $l_5$ which is in the form of a convergent beam is reflected by the second object 2 (although, for convenience, it is illustrated in FIG. 4 as being transmitted), and goes along the optical axis a2 to the sensor 4. The point C2 of the center of gravity of the light $l_5$ is constantly on the optical axis a2, independently of the positional deviation Δ and the gap g. Thus, the point C2 provides a positional reference for the gravity centers C1 and C3 of the other lights on the sensor 4 surface. The optical path for the lights $l_1-l_5$ serves to provide a detection system B.

In this embodiment, the signal processing circuit 5 operates first to detect the positions C1, C2 and C3 of the respective gravity centers of lights $l_4$, $l_5$ and $l_7$, from the data as collected by the sensor 4. Thereafter, the signal processing circuit 5 operates to calculate the interval d1 between the points C1 and C2 and the interval d2 between the points C2 and C3. Subsequently, the signal processing circuit operates to detect the distances y0 and y1, by using the values of distances D1 and D2 which are predetermined, and in accordance with the following equation:

$$\left.\begin{array}{l} Y0 = d1 - D1 \\ Y1 = D2 - d2 \end{array}\right\} \quad (A)$$

Further, by using the values of distances y0 and y1 and by using equations to be described later, the positional deviation Δ and the gap g are detected.

In accordance with the thus obtained information related to the positional deviation Δ and the gap g, as supplied from the signal processing circuit 5, the control circuit 6 operates to actuate the stage controller 7 to move the second object 2 to a predetermined position.

In this embodiment, usable diffraction light is not limited to first order diffraction light. Substantially the same advantageous effects are attainable by use of higher-order diffraction light, such as second order or an order higher than it.

In accordance with the present embodiment, the components such as a light source and a sensor can be collectively disposed at one site. Therefore, an optical probe of small size in structure is attainable. Additionally, since there is no necessity of moving the optical probe at the time of exposure, it is possible to increase the throughput.

Next, referring to FIG. 4, description will be made of details of the manner of detecting any positional deviation Δ and the interval g between the first and second objects 1 and 2, in the present embodiment.

In the detection system C shown in FIG. 4, the light $l_1$ passes through the physical optic elements Z3 and Z5, each having a lens function, and is projected upon the point C3. At this time, the distance y1 to the center of gravity of the light $l_7$, denoted at C3, is of such a value that is determined by the deviation Δ and the interval g between the first and second objects 1 and 2, and usually it is expressed as follows:

$$y1 = F_A 1(\Delta, g)$$

Generally, when there are two unknown quantities, solutions of them are obtainable if there are two equations including these unknown quantities. That is, if there can be prepared two relations such as follows:

$$y1 = F_A 1(\Delta, g) \quad (1)$$

$$y0 = F_A 0(\Delta, g) \quad (2)$$

then, the two unknown quantities Δ and g can be determined by the measurement of the distances y1 and y0.

On a special occasion, if the quantity which is dependent only upon the interval g is denoted by y0=F0(g), then the unknown quantities Δ and g can be determined from the following relations:

$$\left.\begin{array}{l} y0 = F_A 0(g) \\ yN = F_A N(\Delta, g) \end{array}\right\} \quad (3)$$

In the detection system A shown in FIG. 4, the following relation is satisfied:

$$y0 = g \tan\theta_0 \quad (4)$$

In the detection system C, the following relation is satisfied:

$$y1 = (L + 2g - f1)/(f1 - g) \cdot \Delta \quad (5)$$

It will be understood from the foregoing that the positional deviation Δ and the interval g can be determined in accordance with equations (A), (4) and (5) and by using measured values of d1 and d2. While the distances D1 and D2 are predetermined in accordance with the design specifications of the physical optic elements, they can be detected by trial printing.

Figure 6:
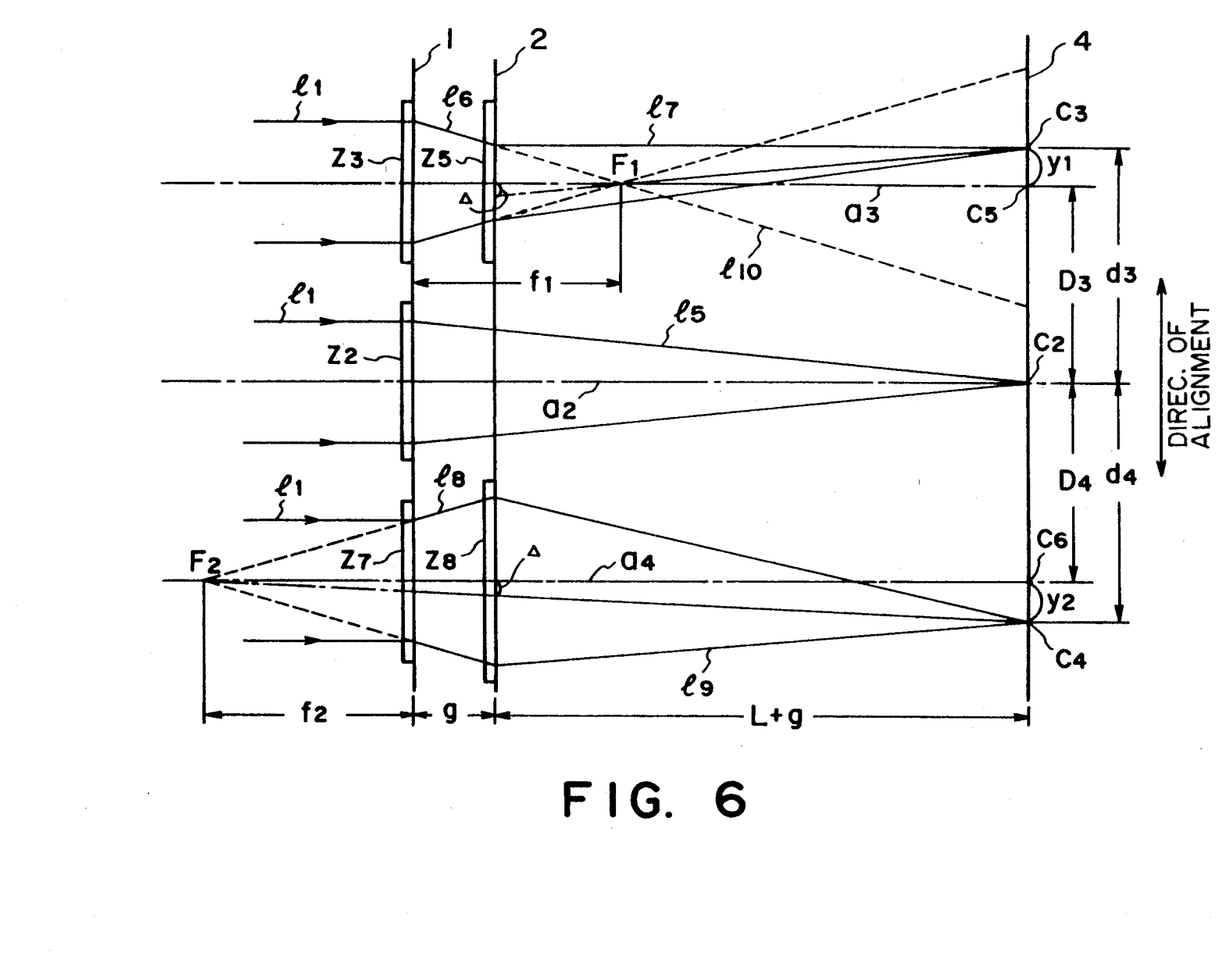
FIG. 6 is a schematic representation, showing in an unfolded view, a major portion of a second embodiment of the present invention.

FIG. 6 is a schematic representation similar to FIG. 4, but shows a major portion of a second embodiment of the present invention. In FIG. 6, the device includes detection systems having substantially the same functions as those of the detection systems B and C of FIG. 3.

Physical optic element Z7 has a concave lens function having a focal point F2 and a focal length f2 and, as a light flux $l_1$ is projected on the physical optic element Z7, the element Z7 produces first order diffraction light $l_8$ which is in the form of a divergent beam. The diffraction light $l_8$ enters another physical optic element Z8 having a convex lens function, whereby first order diffraction light $l_9$ whose direction of diffraction is changeable with a positional deviation $\Delta$ is produced. The diffraction light $l_9$ is focused at a position spaced from the optical axis by a distance y2. The amount of distance y2 at this time is dependent upon the deviation $\Delta$ and the interval g. The optical path for the lights $l_1$, $l_8$ and $l_9$ serves to provide a detection system D.

In this embodiment, the deviation $\Delta$ and the interval g can be detected from two relations, such as follows, which are concerned with the deviation $\Delta$ and the interval g:

$$\left. \begin{array}{l} y1 = F_A1(\Delta, g) \\ y2 = F_A2(\Delta, g) \end{array} \right\} \quad (6)$$

The detection systems C and D correspond to any one of Equation "$y1 = F_A1(\Delta, g)$" and "$y2 = F_A2(\Delta, g)$", and the detection system B provides a reference position C2.

When the point C2 is used as the reference position, from FIG. 6, it follows that:

$$y1 = d3 - D3$$

$$y2 = d4 - D4$$

From these relations, the distances y1 and y2 are detected.

In the present embodiment, with regard to the detection system D, the distance y2 is detected in the following manner:

$$\Delta : y2 = (f2+g) : (f2+g+L+g)$$

$$\therefore y2 = (L+2g+f2)/(f2+g) \cdot \Delta \quad (7)$$

By using equations (5), (6) and (7) and from measured values of d3 and d4, the positional deviation $\Delta$ and the interval g can be detected.

Since the center of gravity of the light spot formed by a zero-th order diffraction light component $l_{10}$ of the light $l_6$ is always coincident with the optical axis a3, regardless of any shift of the position of the second object 2, it may be used in place of the detection system B. On that occasion, the point C5 provides a reference position. Such an embodiment will be explained below.

Figure 7:
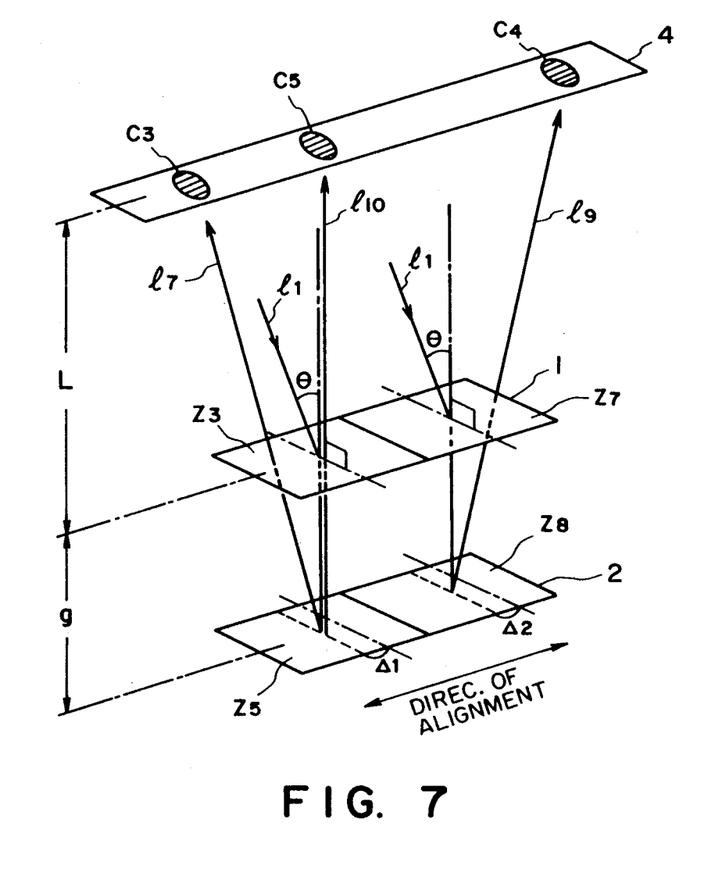
FIG. 7 is a schematic representation, showing a major portion of a third embodiment of the present invention.

FIG. 7 is a schematic representation of a major portion of a third embodiment of the present invention. While in this embodiment light flux $l_1$ is incident on the first object 1 with an angle $\theta$, basic operation of this embodiment is substantially the same as that of the second embodiment shown in FIG. 6.

The detection systems shown in FIG. 7 are of the same structure as those of the detection systems C and D shown in FIG. 6.

One important feature of the present embodiment, as compared with the FIG. 6 embodiment, is that as a reference position the center of gravity of light $l_{10}$ impinging on the point C5 is detected. Detection of the point C5 leads to that, when the deviation between the first and second objects 1 and 2 approaches to zero, i.e., when they are aligned, the center of gravity of light at C3 and the center of gravity of light at C5 coincide with each other. In consideration thereof, the physical optic elements Z3, Z7, Z5 and Z8 are arranged so that, when the first and second objects are in alignment with each other, the optical axes of the elements Z3 and Z7 and the optical axes of the elements Z5 and Z8 are mutually deviated by $\delta 1$ and $\delta 2$, respectively. This avoids overlapping of the gravity centers when correct alignment of the objects is established.

It will be understood from the foregoing that, when the first and second objects 1 and 2 are deviated by $\Delta$ from each other, $\Delta$ in equation (6) may be replaced in the following manner:

$$\Delta 1 = \Delta + \delta 1$$

$$\Delta 2 = \Delta + \delta 2$$

Figure 8:
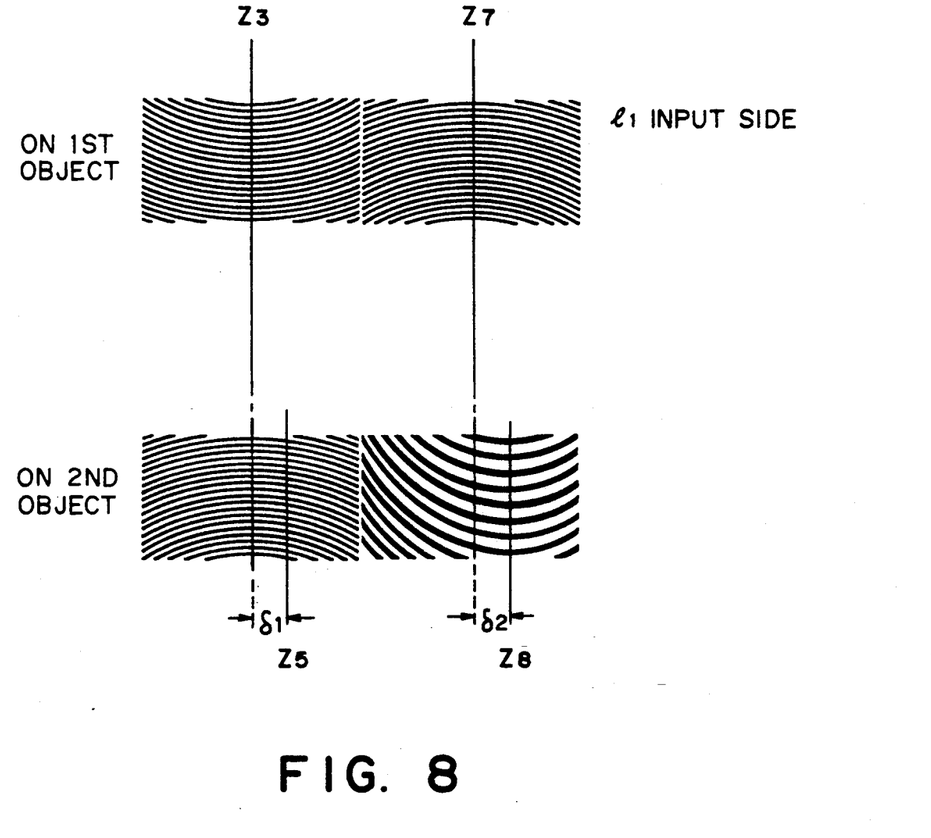
FIG. 8 is a schematic representation, showing examples of patterns of physical optic elements provided on first and second objects.

FIG. 8 shows examples of patterns which can be used as the physical optic elements Z3, Z7, Z5 and Z8 provided on the first and second objects 1 and 2 of the present embodiment. In FIG. 8, character $\delta 1$ denotes the amount of deviation between the optical axes of the physical optic elements Z3 and Z5, while character $\delta 2$ denotes the amount of deviation between the optical axes of the physical optic elements Z7 and Z8.

Figure 9:
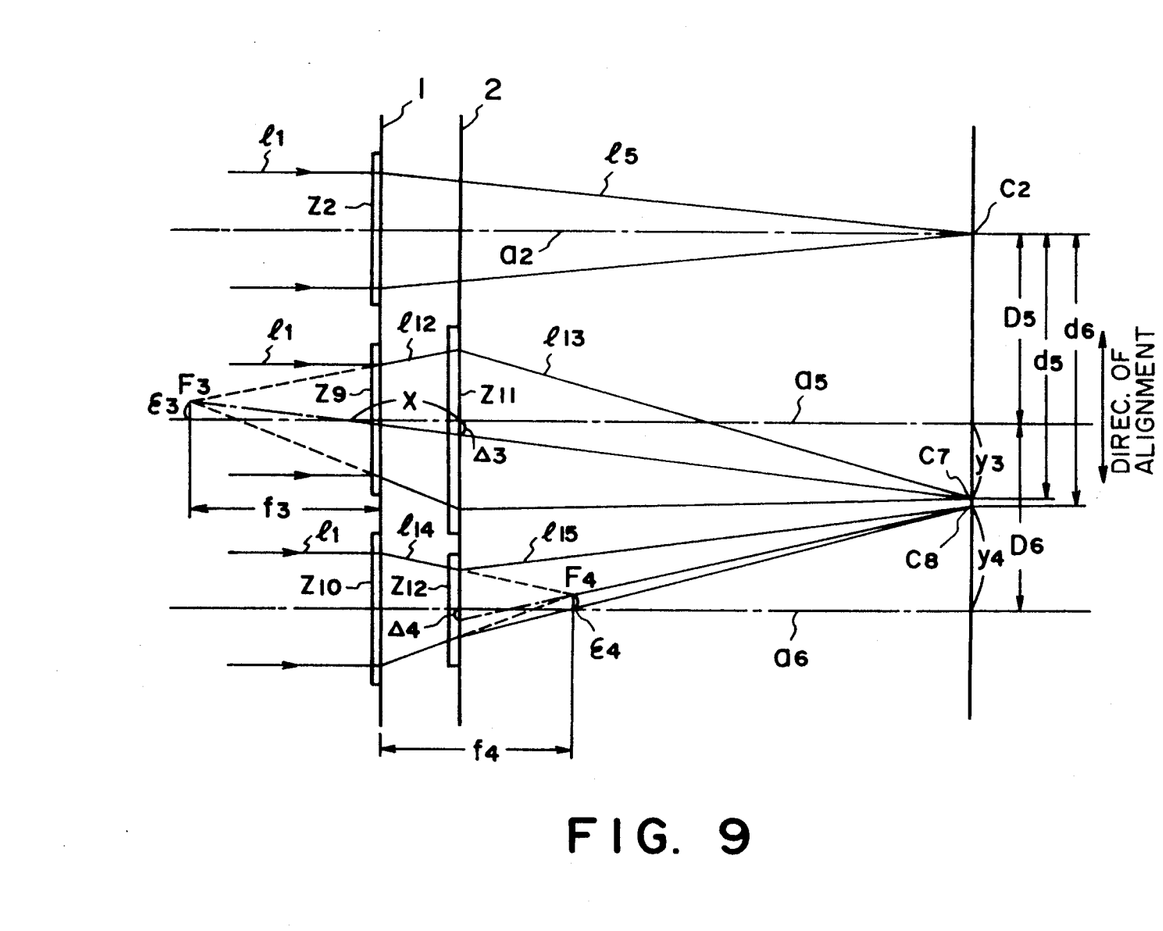
FIG. 9 is a schematic representation, showing in an unfolded view, a major portion of a fourth embodiment of the present invention.

FIG. 9 is a schematic representation similar to FIG. 4, but shows a major portion of a fourth embodiment of the present invention. In this embodiment, physical optic element Z9 has a concave lens function having a focal point F3 and a focal length f3, and physical optic element Z10 has a convex lens function having a focal point F4 and a focal length f4. There are provided additional physical optic elements Z11 and Z12 having a convex lens function and a concave lens function, respectively.

In the present embodiment, each of the physical optic elements Z9 and Z10 provided on the first object 1 has an eccentricity by which the focal point position is deviated by $\epsilon 3$ or $\epsilon 4$ from a normal to the physical optic element. As a result, even in correct alignment, the optical axes of the physical optic elements on the first and second objects are mutually deviated (by an amount $\delta$).

Accordingly, as in the embodiment of FIG. 7, if the first and second objects are deviated by $\Delta$, then $\Delta$ in equation (6) is substituted in the following manner:

$$\Delta 3 = \Delta + \delta 3$$

$$\Delta 4 = \Delta + \delta 4$$

When, in this embodiment, the light $l_1$ is incident on the physical optic elements Z9 and Z10, there are produced first order diffraction lights $l_{12}$ and $l_{14}$. The lights $l_{12}$ and $l_{14}$ are projected on the physical optic elements Z11 and Z12 and, in response, there are produced first order diffraction lights $l_{13}$ and $l_{15}$ which are focused at points spaced by distances y3 and y4, respectively, from the optical axes a5 and a6, respectively.

In this embodiment, the optical path for the lights $l_1$-$l_{13}$ serves to provide a detection system E, and in this detection system E the following relations are provided:

$$\Delta 3 : y3 = x : (x + L + g)$$

$$\Delta 3 : \epsilon 3 = x : (f3 + g - x)$$

$$\therefore y3 = [(L+g)/(f3+g)](\epsilon 3 + \Delta 3) + \Delta 3 \quad (8)$$

On the other hand, the optical path for lights $l_1$ to $l_{15}$ serves to provide a detection system F, and in this detection system F the following relation is provided:

$$y4 = [(L+g)/(f4-g)](\epsilon 4 + \Delta 4) + \Delta 4 \quad (9)$$

The point C2 of the center of gravity of light in the detection system B provides, like the detection system B shown in FIG. 4, a reference for the other positions. As compared with the foregoing embodiments, in this embodiment it is not necessary that the optical axis of the detection system B is positioned intermediate the optical axes of the other two detection systems. It may be positioned at any desired location.

In the present embodiment, the distances y3 and y4 can be detected by the following equations:

$$y3 = d5 - D5$$

$$y4 = (D5 + D6) - d6$$

Figure 10:
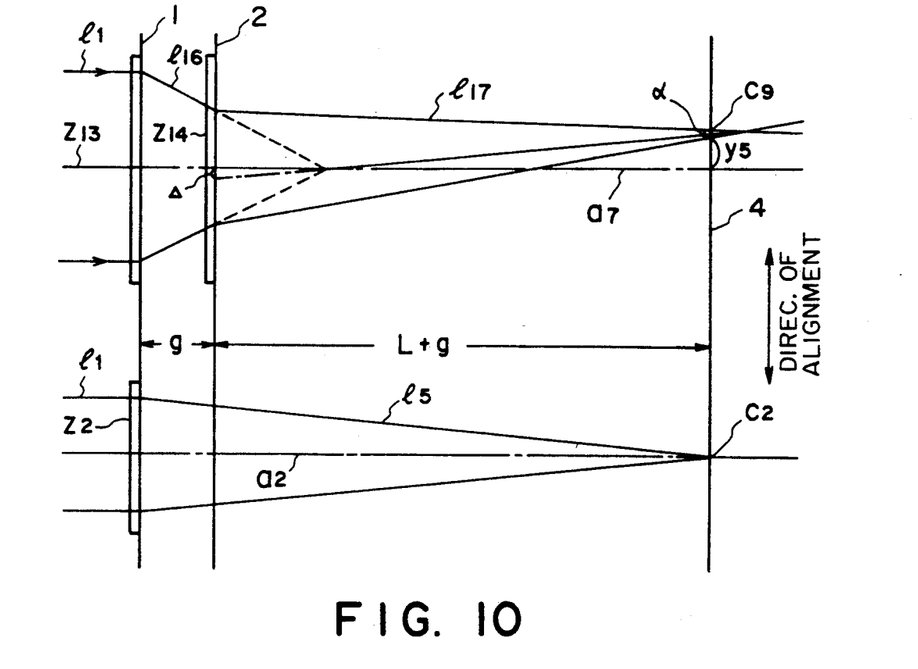
FIG. 10 is a schematic representation, showing in an unfolded view, a major portion of a fifth embodiment of the present invention.

FIG. 10 is a schematic representation similar to FIG. 4, but shows a major portion of a fifth embodiment of the present invention. Physical optic elements Z13 and Z14 are provided and they have a convex lens function and a concave lens function, respectively.

In the illustrated state, the interval g between the first and second objects 1 and 2 is not correct and, as a result, a light spot image on the sensor surface is shifted or defocused. As will be understood from the illustration, any change in the interval g causes a change in the half width $\alpha$ of the light spot on the sensor. Also, a change in the deviation $\Delta$ results in a change in the half width $\alpha$. Therefore, the half width $\alpha$ can be expressed by "$\alpha = F_A 3(\Delta, g)$".

The functional form of $F_A 3(\Delta, g)$ can be expressed in the following manner:

In FIG. 10, it is assumed that the focal lengths of the physical optic elements Z13 and Z14 are denoted by f13 and f14, respectively, and that the size of a spot formed on the sensor 4 surface by the diffraction light from the physical optic elements Z13 and Z14 becomes smallest when the interval between the mask 1 and the wafer 2 is equal to g0. On that occasion, the following relation is satisfied:

$$-1/f_{14} + 1/(f_{13} - g_0) = 1/(L + g_0)$$

That is, the distance from the wafer to the position of such smallest spot, along the optical axis, is equal to $L + g_0$. If, on this occasion, the interval between the mask and the wafer changes to g, then a smallest spot is formed at a distance, along the optical axis, which can be expressed as follows:

$$[-1/f_{14} + 1/(f_{13} - g)]^{-1} = f_{14}(f_{13} - g)/(f_{14} - f_{13} + g)$$

This means that a minimum spot of diffraction light is formed at a position spaced in the direction of the optical axis from the sensor surface by:

$$f_{14}(f_{13} - g)/(f_{14} - f_{13} + g) - (L + g)$$

It is seen from the above that the size (expansion) of a signal light spot on the sensor increases both when the mask-to-wafer interval is larger than the predetermined interval g0 and when the mask-to-wafer interval is smaller than g0. The relationship can be predetected by selecting those values with which the mask-to-wafer interval is changed from $g_0$ by $\Delta g$. Namely, it is detectable in advance in terms of the half width of the spot on the sensor, i.e.:

$$\alpha(\Delta g) = \alpha_0 + \sum_{i=1}^{N} A_i (\Delta g)^i$$

In other words, Ai (i=1, ... and N) is predetected.

Further, if there is a relative positional deviation between the mask and the wafer in a direction parallel to them, the effective diffraction area of the physical optic element Z14 as it receives the light $l_{16}$ to diffract the same, reduces. This leads to that, due to the diffraction by the effective pattern area of the physical optic element Z14, the expansion of the spot of the diffraction light formed on the sensor surface is changeable. Namely, the spot becomes smallest when $\Delta = 0$. As the deviation $\Delta$ increases, the effective pattern area of the physical optic element Z14 becomes narrower, relative to the light $l_{16}$ and the expansion of the spot on the sensor becomes larger.

Assuming now that the pattern area size of the physical optic element Z14 is S, with the deviation between the mask and the wafer, the effective pattern area size of the physical optic element Z14 reduces in relation to $(S - \Delta)/S$ and, therefore, substantially in inverse proportion to this, the size of the spot on the sensor increases (provided that $S << \Delta$).

Including $\Delta$ and g, from the foregoing it follows that:

$$\alpha = S/(S - \Delta) \left[ \alpha_0 + \sum_{i=1}^{N} A_i (\Delta g)^i \right] = F_A 3(\Delta, g)$$

wherein $\Delta g = g - g_0$.

On the other hand, the distance y5 between the optical axis a7 and the center of gravity of the spot C9 is given by:

$$y5 = F_A 5(\Delta, g) = (L + 2g - f_{13})/(f_{13} - g) \times \Delta$$

wherein $f_{13}$ is the focal length of the physical optic element Z13. From this, it follows that:

$$\begin{cases} \alpha = F_A 3(\Delta, g) \\ y5 = F_A 5(\Delta, g) \end{cases}$$

From these two equations, the values of $\Delta$ and g are detected.

In this embodiment, there are two sites, before and after the imaging point, at which the half width $\alpha$ has the same value. Thus, by moving the second object 2 rightwardly or leftwardly, whether the point is before or after the imaging point is discriminated.

The present embodiment is a special case where two equations are obtained from one detection system.

In this embodiment, with a larger angle of convergence of light, the change in the half width of light per unit length in the direction of the optical axis is larger. Therefore, the change in the half width with the change in the interval g can be detected with a good sensitivity. Namely, the depth of focus of the lens system becomes short and, as a result, the change in the half width $\alpha$ can be detected with a good sensitivity.

It is seen from the drawing that with a larger length of each physical optic element Z13 or Z14 in the alignment direction, better sensitivity of the detection system is attainable.

While for measurement of the distance y5 an arrangement such as the detection system B which can provide a reference position is necessary, use may be made as in the fifth embodiment of such light $l_{16}$ that passes through the physical optic element Z14 as zero-th order diffraction light and impinges on the sensor 4.

Figure 11:
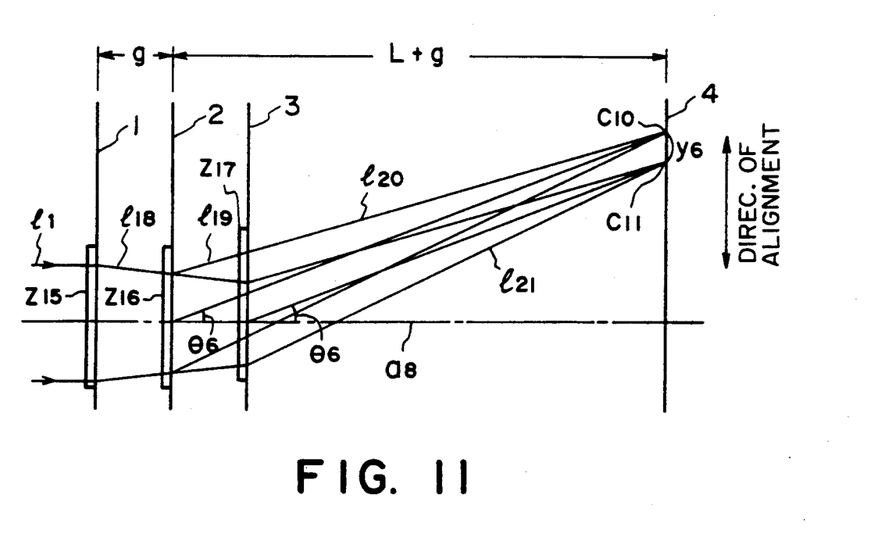
FIG. 11 is a schematic representation, showing in an unfolded view a major portion of a sixth embodiment of the present invention.

FIG. 11 is a schematic representation of a major portion of a sixth embodiment of the present invention. This embodiment corresponds to a modified form of the detection system A shown in FIG. 4, wherein the distance y0 is replaced by a quantity y6 which is dependent only upon the interval g between the first and second objects 1 and 2. Namely, in this embodiment, a relation $y6=F_A(g)$, corresponding to the relation $y0=F_A0(g)$ in equation (3), is used.

In FIG. 11, as light flux $l_1$ is incident on physical optic element Z15 having a convex lens function, there is produced first order diffraction light $l_{18}$ which is in the form of a convergent beam. As the diffraction light $l_{18}$ impinges on a physical optic element Z16 having only a deflecting function, zero-th order diffraction light is transmitted and emanates therefrom. At the same time, first order diffraction light $l_{20}$ with the chief ray being deflected in a direction of an angle $\theta 6$, is produced.

On the other hand, the zero-th order diffraction light component of the diffraction light $l_{18}$ impinges on a physical optic element Z17 which is provided on the first object and which has only a light deflecting function, in response to which impingement there is produced first order diffraction light $l_{21}$ whose chief ray is deflected in a direction of an angle $\theta 6$. These diffraction lights $l_{20}$ and $l_{21}$ are focused at points C10 and C11, respectively, on the sensor 4 surface.

In this embodiment, the optical path for the lights $l_1$ to $l_{20}$ or $l_{21}$ serves to provide a detection system G.

In this embodiment, the distance y6 between the points C10 and C11 can be detected by the following equation:

$$y6 = g \cdot \tan\theta 6$$

From this, the interval g can be detected. The remaining portion of this embodiment is substantially the same as the corresponding portion of the FIG. 4 embodiment and, like the first embodiment, the values of g and $\Delta$ can be detected.

In accordance with the present invention, any positional deviation $\Delta$ between the first and second objects as well as the interval g between the first and second objects are detected. This avoids incorrect discrimination of the state of alignment between these objects. Also, it is possible to correct the detected deviation $\Delta$ by using the value of the interval g. As a result, it is possible to provide an alignment system having high alignment precision and attaining high throughput. As an example, when the alignment is to be made by using the detecting system C of the alignment system of the present invention, under the conditions of $g=30$ microns, $f1=100$ microns, $L=18000$ microns and $y1=300$ microns, and if there is an error of 0.3 micron in the interval g, there occurs an error of 0.005 micron in the deviation $\Delta$. Therefore, when the alignment with a precision of 0.01 micron is desired, it is necessary to suppress the error in the interval g to 0.3 micron or less.

In accordance with the present invention, the positional deviation $\Delta$ and the interval g can be measured at the same time and the error in the interval g can be reduced to 0.3 micron or less. As a result, an alignment precision of 0.01 micron is attainable.

Further, in accordance with the present invention, physical optic element means is used both for the detection of the positional deviation $\Delta$ and for the detection of the interval g. This reduces the number of required physical optic elements or lights, thus making the detection system simple and reducing the size of the apparatus as a whole.

Additionally, quantities on a sensor such as the distances y1 and y2 can be detected each in terms of a difference between two values. It is therefore possible to cancel any error which might be caused by inclination of the second object 2 in the alignment direction. As a result, more accurate alignment is assured.

While the invention has been described with reference to the structures disclosed herein, it is not confined to the details set forth and this application is intended to cover such modifications or changes as may come within the purposes of the improvements or the scope of the following claims.

What is claimed is:

1. A device for detecting a positional relationship between first and second objects, said device comprising:

light source means for projecting light to irradiate the first and second objects;

photodetecting means for detecting light from the first and second objects irradiated with the light projected from said light source means, said detecting means comprising means for detecting first detected light whose position of incidence upon a predetermined plane is dependent upon the positional relationship of the first and second objects in a direction along an interval therebetween and in a direction perpendicular to the interval, means for detecting second detected light whose position of incidence upon the predetermined plane is dependent upon the positional relationship of the first and second objects in the direction of the interval therebetween, and means for detecting third detected light whose position of incidence upon the predetermined plane is independent of the positional relationship of the first and second objects in both the direction of the interval and the direction perpendicular to the interval; and positional relationship detecting means for detecting the positional relationship of the first and second objects in the direction of the interval and in the direction perpendicular to the interval, on the basis of the detection by said photodetecting means.

2. A device according to claim 1, wherein the position of incidence of the second detected light on the predetermined plane is further dependent upon the positional relationship of the first and second objects in the direction perpendicular to the interval.

3. A device according to claim 1, wherein the position of incidence of the second detected light on the predetermined plane is independent of the positional relationship of the first and second object in the direction perpendicular to the interval.

4. A device according to claim 1, wherein the first object comprises a mask and the second object comprises a wafer.

5. A device according to claim 4, wherein said mask and said wafer are each provided with a zone plate pattern.

6. A device according to claim 5, wherein the first detected light comprises light converged or diverged by the zone plate patterns of said mask and said wafer.

7. A device according to claim 6, wherein the second detected light comprises light converged or diverged by the zone plate patterns of said mask and said wafer.

8. A device according to claim 6, wherein the third detected light comprises light converged or diverged by the zone plate patterns of said mask and said wafer.

9. A device according to claim 4, wherein said photodetecting means includes a single sensor array having a light receiving surface and wherein the first, second and third detected lights are incident on different positions on the light receiving surface of said sensor array.

10. A method of detecting a positional relationship between first and second objects, said method comprising the steps of:
projecting light from a light source to irradiate the first and second objects;
receiving light from the first and second objects irradiated with the light from the light source, detecting first received light whose position of incidence upon a predetermined plane is dependent upon the positional relationship of the first and second objects in a direction along an interval therebetween and in a direction perpendicular to the interval, detecting second received light whose position of incidence upon the predetermined plane is dependent upon the positional relationship of the first and second objects in the direction of the interval therebetween, and detecting third received light whose position of incidence upon the predetermined plane is independent of the positional relationship of the first and second objects in both the direction of the interval and the direction perpendicular to the interval; and
detecting the positional relationship of the first and second objects in the direction of the interval and in the direction perpendicular to the interval, on the basis of the detections in said detecting steps.

11. A method according to claim 10, wherein the first object comprises a mask and the second object comprises a wafer.

12. A method according to claim 11, wherein the mask and the wafer are each provided with a zone plate pattern.

13. A method according to claim 12, wherein the first detected light comprises light converged or diverged by the zone plate patterns of the mask and the wafer.

14. A method according to claim 13, wherein the second detected light comprises light converged or diverged by the zone plate patterns of the mask and the wafer.

15. A method according to claim 13, wherein the third detected light comprises light converged by the zone plate pattern of the mask and reflected by the surface of the wafer.

16. A method according to claim 13, wherein the second detected light comprises light converged or diverged only by the zone plate pattern of the mask.

17. A method according to claim 13, wherein the third detected light comprises light converged or diverged by the zone plate pattern of the mask and reflected by the surface of the wafer.

* * * * *

UNITED STATES PATENT AND TRADEMARK OFFICE
CERTIFICATE OF CORRECTION

PATENT NO. : 5,148,037
DATED : September 15, 1992
INVENTOR(S) : Shigeyuki Suda, et al.

It is certified that error appears in the above-identified patent and that said Letters Patent is hereby corrected as shown below:

COLUMN 2

Line 28, "of" should be deleted.

COLUMN 4

Line 61, "in" should be deleted.

COLUMN 5

Line 43, "as" should be deleted.

COLUMN 8

Line 3, "to" should be deleted.

COLUMN 10

Line 37, "S<<Δ)." should read --S>>Δ).--.

Signed and Sealed this

Nineteenth Day of October, 1993

Attest:

BRUCE LEHMAN

Attesting Officer   Commissioner of Patents and Trademarks